United States Patent
Blair et al.

(10) Patent No.: US 7,719,378 B2
(45) Date of Patent: *May 18, 2010

(54) FLEXIBLE INTERCONNECT CABLE FOR AN ELECTRONIC ASSEMBLY

(75) Inventors: James Leroy Blair, San Diego, CA (US); Oswin M. Schreiber, San Diego, CA (US); Jeffrey Thomas Smith, Poway, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/009,740

(22) Filed: Jan. 22, 2008

(65) Prior Publication Data

US 2008/0116988 A1    May 22, 2008

Related U.S. Application Data

(63) Continuation of application No. 11/588,640, filed on Oct. 27, 2006, now Pat. No. 7,336,139, which is a continuation of application No. 10/951,020, filed on Sep. 27, 2004, now Pat. No. 7,145,411, which is a continuation of application No. 10/107,667, filed on Mar. 26, 2002, now Pat. No. 6,797,891.

(60) Provisional application No. 60/365,696, filed on Mar. 18, 2002.

(51) Int. Cl.
 *H01P 3/08* (2006.01)
(52) U.S. Cl. .......................................... 333/1; 333/260
(58) Field of Classification Search ................. 333/1, 333/4, 5, 238, 260
See application file for complete search history.

(56) References Cited

U.S. PATENT DOCUMENTS

| 2,997,521 A | 8/1961 | Dahlgren |
| 3,579,206 A | 5/1971 | Grange ........................ 340/173 |
| 3,772,776 A | 11/1973 | Weisenburger ............... 29/628 |
| 4,753,005 A | 6/1988 | Hasircoglu |
| 4,800,461 A | 1/1989 | Dixon et al. ................. 361/398 |
| 5,021,866 A | 6/1991 | Sudo et al. .................... 357/70 |
| 5,072,074 A | 12/1991 | DeMaso et al. ............. 174/254 |

(Continued)

FOREIGN PATENT DOCUMENTS

WO    9940627    8/1999

OTHER PUBLICATIONS

Yamanaka, N. et al., "320 Gb/s High-Speed ATM switching System Hardware Technologies Based on Copper-Polyimide MCM", IEEE Trans. on Components, Packaging and Manufacturing Technology, Part B, vol. 18, No. 1, Feb. 1995, pp. 83-91.

(Continued)

*Primary Examiner*—Benny Lee
(74) *Attorney, Agent, or Firm*—Jiayu Xu

(57) ABSTRACT

A high speed flexible interconnect cable for an electronic assembly includes a number of conductive layers and a number of dielectric layers. Conductive signal traces, located on the conductive layers, combine with the dielectric layers to form one or more high speed electrical transmission line structures. The cable can be coupled to electronic components using a variety of connection techniques. The cable can also be terminated with any number of known or standardized connector packages.

27 Claims, 12 Drawing Sheets

U.S. PATENT DOCUMENTS

| | | | |
|---|---|---|---|
| 5,083,238 A | 1/1992 | Bousman | 361/413 |
| 5,206,712 A | 4/1993 | Kornrumpf et al. | 361/393 |
| 5,264,787 A | 11/1993 | Woith et al. | 324/158 |
| 5,296,651 A | 3/1994 | Gurrie et al. | 174/254 |
| 5,345,205 A | 9/1994 | Kornrumpf | 333/246 |
| 5,349,317 A | 9/1994 | Notani | 333/236 |
| 5,363,275 A | 11/1994 | Frankeny et al. | 361/749 |
| 5,373,108 A | 12/1994 | Yabrand | |
| 5,385,478 A | 1/1995 | Niekawa | |
| 5,408,053 A | 4/1995 | Young | 174/264 |
| 5,500,489 A | 3/1996 | Shah et al. | 174/117 |
| 5,580,272 A | 12/1996 | Yamaguchi et al. | |
| 5,597,470 A | 1/1997 | Karavakis et al. | |
| 5,621,333 A | 4/1997 | Long et al. | 324/762 |
| 5,631,446 A | 5/1997 | Quan | 174/254 |
| 5,631,466 A | 5/1997 | Botti et al. | |
| 5,632,646 A | 5/1997 | Ii et al. | |
| 5,695,360 A | 12/1997 | Seto et al. | |
| 5,742,484 A | 4/1998 | Gillette et al. | 361/789 |
| 5,904,586 A | 5/1999 | Takayasu | |
| 6,007,349 A | 12/1999 | Distefano et al. | |
| 6,027,958 A | 2/2000 | Vu et al. | 438/110 |
| 6,040,524 A | 3/2000 | Kobayashi et al. | 174/36 |
| 6,086,386 A | 7/2000 | Fjelstad et al. | |
| 6,116,947 A | 9/2000 | Takayasu | |
| 6,124,637 A | 9/2000 | Freyman et al. | 257/736 |
| 6,186,811 B1 | 2/2001 | Tojo et al. | |
| 6,281,451 B1 | 8/2001 | Chan et al. | |
| 6,300,802 B1 | 10/2001 | Smetana | |
| 6,383,017 B1 | 5/2002 | Takayasu | |
| 6,383,401 B1 | 5/2002 | Labzentis et al. | |
| 6,386,905 B1 | 5/2002 | Ito | |
| 6,515,233 B1 | 2/2003 | Labzentis et al. | |
| 6,559,389 B1 | 5/2003 | Kornrumpf et al. | 174/254 |
| 6,590,466 B2 | 7/2003 | Lin et al. | 333/1 |
| 6,677,832 B1 | 1/2004 | Guinn et al. | |
| 6,797,891 B1 | 9/2004 | Blair et al. | 174/268 |
| 6,809,608 B2 | 10/2004 | Fjelstad | |
| 6,867,668 B1 | 3/2005 | Dagostino et al. | 333/246 |
| 6,884,108 B2 | 4/2005 | Saito et al. | |
| 6,932,648 B1 | 8/2005 | Chiu et al. | |
| 7,021,969 B2 | 4/2006 | Matsunaga | |
| 7,121,874 B1 | 10/2006 | Jeon | |
| 7,145,411 B1 | 12/2006 | Blair et al. | 333/5 |
| 7,212,088 B1 | 5/2007 | Norregaard et al. | |
| 7,298,754 B1 | 11/2007 | Miller et al. | |
| 7,336,139 B2 * | 2/2008 | Blair et al. | 333/1 |
| 2002/0197906 A1 | 12/2002 | Fuerst et al. | |

OTHER PUBLICATIONS

National Semiconductor, LVDS Owner's Manual, A General Design Guide for National's Low Voltage Differential Signaling (LVDS) and Bus LVDS Products, 2nd Edition, Revision 2.0—Spring 2000.

Fjelstad, Joseph, "Flexible Circuit Technology", 2nd Edition, Aug. 1998, Chapters 5-6, pp. 73-152, Silicon Valley Publishers Group, Sunnyvale, CA.

Fjelstad, Joseph, "An Engineer's Guide to Flexible Circuit Technology", Chapter 4, pp. 52-97, Electrochemical Publications Ltd., 1997.

Handbook of Flexible Circuits, Edited by Ken Gilleo, Kluwer Academic Publishers Group, 2001 (original publication 1992), Chapters 3-6, pp. 42-122.

Introduction to Common Printed Circuit Transmission Lines, Jun. 2, 2003, AN2093, Maxim Integrated Products.

Fjelstad, Joseph, Flexible circuitry-technology background and important fundamental issues, Circuit World 25/2, 1999, pp. 6-10.

Pham, A., et al., Development of Vertical Interconnects for Mixed Substrate Technology, IEEE 54th ARFTG Conference Digest, Atlanta GA, Dec. 1999, pp. 132-136.

Burkard, Hans, et al., An ultra-thin, highly flexible Multilayer (2007).

Rapala, T., et al., New Materials and Build-up Constructions for Advanced Rigid-Flex PCB Applications (Jun. 1, 2005), EPIC Winter Conference, Barcelona.

Buck, T.J., High Density Flex-rigid Circuits—A Solution for Board-to-board Transmission Line Interconnects, Circuit World, vol. 19, No. 4 (1993), pp. 21-27.

"A General Design Guide for National's Low Voltage Differential Signaling (LVDS) and Bus LVDS Products", LVDS Owner's Manual - Moving Info With LVDS, National Semiconductor, p. 47, 2nd Edition, Rev. 2.0, Spring 2000.

* cited by examiner

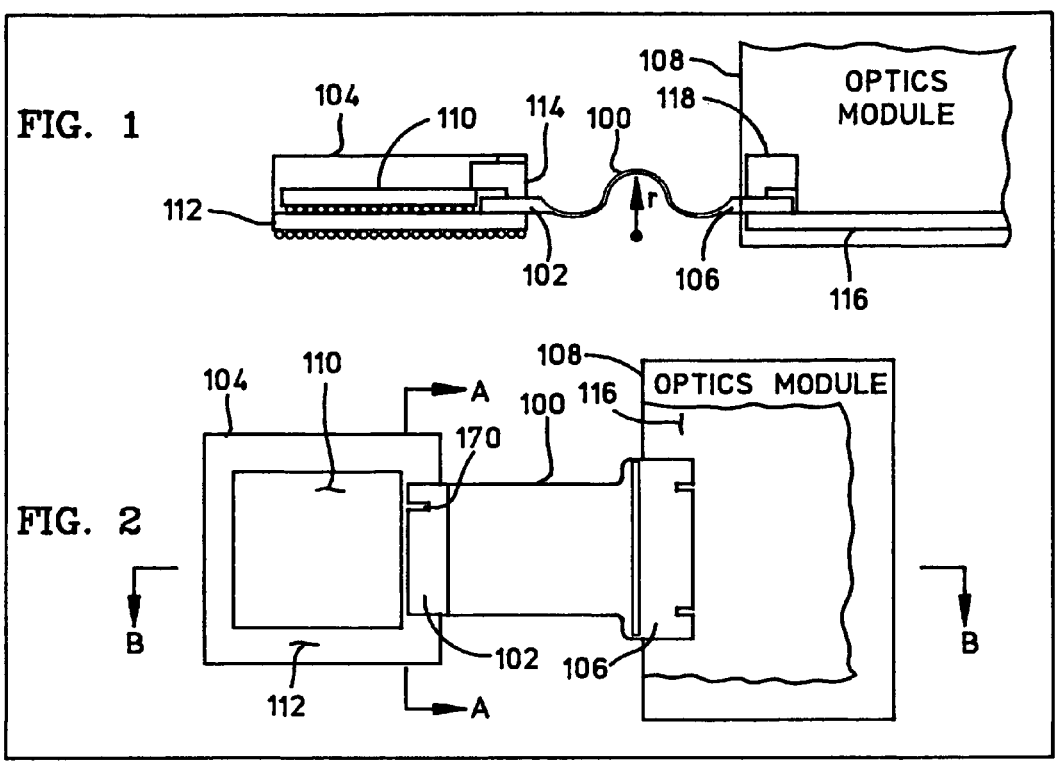
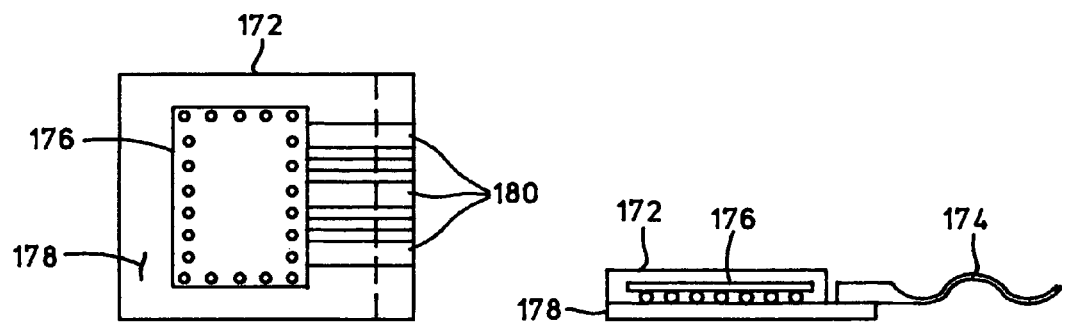

FLEXIBLE INTERCONNECT CABLE FOR AN ELECTRONIC ASSEMBLY

CROSS-REFERENCE TO RELATED APPLICATIONS

This application is a continuation of U.S. patent application Ser. No. 11/588,640, filed Oct. 27, 2006, now U.S. Pat. No. 7,336,139, which is a continuation of U.S. patent application Ser. No. 10/951,020 filed on Sep. 27, 2004, now U.S. Pat. No. 7,145,411, which is a continuation of U.S. patent application Ser. No. 10/107,667 filed on Mar. 26, 2002, now U.S. Pat. No. 6,797,891, which claims priority of U.S. Provisional Application No. 60/365,696, filed on Mar. 18, 2002, all of which are incorporated by reference herein.

The subject matter of this application is related to the subject matter of U.S. patent application Ser. No. 10/107,661, titled "FLEXIBLE HIGH FREQUENCY INTERCONNECT CABLE INTEGRATED WITH A CIRCUIT SUBSTRATE," now U.S. Pat. No. 6,797,891, and U.S. patent application Ser. No. 10/107,662, titled "HIGH FREQUENCY SIGNAL TRANSMISSION FROM THE SURFACE OF A CIRCUIT SUBSTRATE TO A FLEXIBLE INTERCONNECT CABLE," now U.S. Pat. No. 6,867,668. The content of both of these applications is incorporated by reference herein.

FIELD OF THE INVENTION

The present invention relates generally to interconnect devices for electronic components. More particularly, the present invention relates to a flexible interconnect cable design suitable for use in very high frequency applications.

BACKGROUND OF THE INVENTION

Many telecommunication and data communication systems support very high speed data and/or clock rates. For example, many practical digital communication systems process data at speeds of up to 40 Gigabits/second ("Gbps"), and the fiber optics telecommunication industry (and other technology sectors) continue to develop communication systems capable of handling even faster data rates. Practical high speed data communication systems employ a number of interconnected elements such as electronic devices, components, modules, circuit boards, subassemblies, and the like. High speed clock/data inputs and outputs of such elements must be interconnected at the subsystem and system levels.

The prior art contains a limited number of interconnect solutions suitable for use at very high speeds (e.g., 40 Gbps and higher). For example, single-ended threaded microwave connectors and microwave interconnect cabling is often utilized between integrated circuit packages, electronic components, and optical modules. Such connectors, however, require cumbersome cable layouts, require large specialized component packages, and preclude the use of differential signaling (which provides a number of advantages such as common mode immunity). In an effort to eliminate bulky connectors and cabling altogether, recent industry proposals have centered around complex interconnections between the integrated circuit substrate and the optics module substrate, where such interconnections utilize various wire bonding and specialized signal launch techniques (an approach requiring intimate device co-location and precise package alignment).

Very high speed integrated circuit chips are often manufactured in the form of a flip chip die having a number of high speed inputs and outputs. A common interconnect technique employs a circuit substrate (such as a ball grid array (BGA) substrate) upon which the flip chip die is mounted. The circuit substrate includes multiple conductive layers separated by insulating layers and conductive vias that form an interconnect structure for both high speed and low speed signals; the circuit substrate itself is then mounted to a circuit board or card. The substrate acts as an interposer, redistributes signals from the fine pitch chip solder bumps to the BGA solder balls, and provides coefficient of thermal expansion matching. The design of the high speed signal interconnects in the circuit substrate can be complex and time consuming, resulting in added manufacturing costs. In addition, such circuit substrates must be custom designed to accommodate the physical and electrical characteristics of the flip chip die and/or the physical and electrical characteristics of the subassembly circuit board/card.

SUMMARY OF THE INVENTION

A flexible electrical interconnect cable according to the present invention facilitates high speed signal transmission between electrical devices, components, modules, circuit boards, and the like. The interconnect cable provides a relatively low cost solution for high speed applications that support data rates of 40 Gbps (and higher). The interconnect cable may also be integrated with a circuit substrate in a manner that eliminates the need to design high speed interconnects within the circuit substrate, e.g., the printed circuit board.

The above and other aspects of the present invention may be carried out in one form by an electrical interconnect cable comprising a flexible dielectric layer and a flexible conductive layer coupled to the flexible dielectric layer, where the flexible conductive layer includes a number of conductive traces of a high-frequency electrical transmission line structure.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

FIG. 1 is a side view of an integrated circuit package connected to an optics module via a flexible interconnect cable;

FIG. 2 is a cutaway top view of the arrangement shown in FIG. 1;

FIG. 10 is a cutaway top view of an integrated circuit package having a carrier substrate compatible with a flexible interconnect cable;

FIG. 11 is a side view of the integrated circuit package shown in FIG. 10 with a flexible interconnect cable coupled thereto;

DETAILED DESCRIPTION OF PREFERRED EMBODIMENTS

Figure 3:
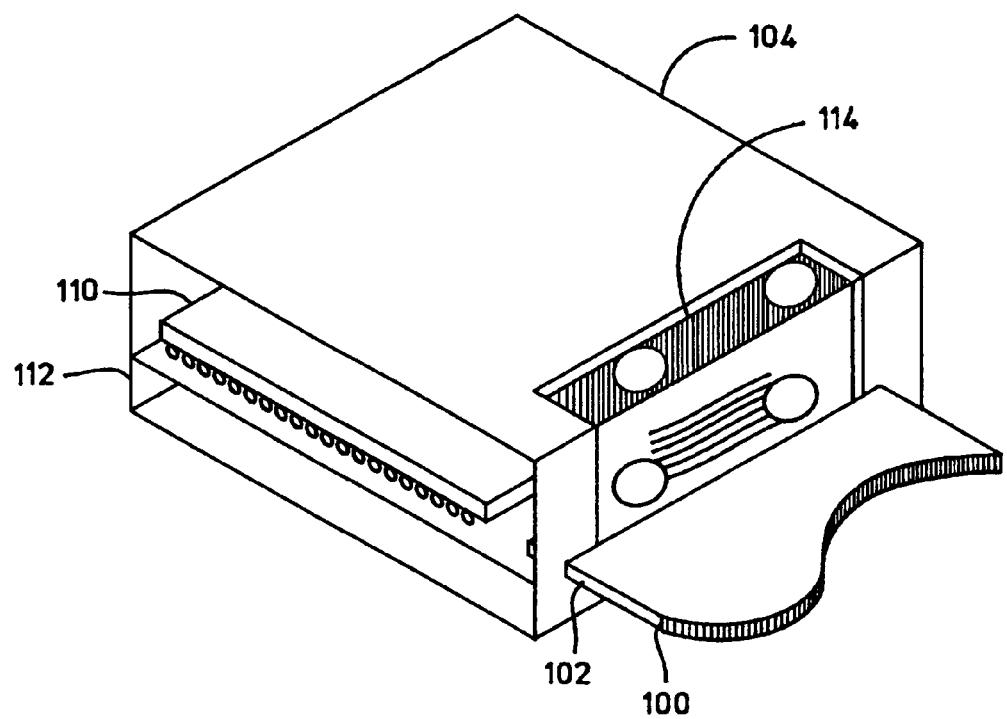
FIG. 3 is a cutaway perspective view of a portion of the arrangement shown in FIG. 1.

The particular implementations shown and described herein are illustrative of the invention and its best mode and are not intended to otherwise limit the scope of the invention in any way. Indeed, for the sake of brevity, conventional RF and microwave transmission line design techniques, flip chip and ball grid array design considerations, substrate interconnect and via design techniques, and manufacturing techniques such as laminating, metal deposition, etching, and the like may not be described in detail herein. In addition, various electronic devices, system components, or modules may be referred to herein as example components to which a flexible interconnect cable may be connected. In practice, the specific type of device, circuit, chip, package, module, circuit board, or component can vary from application to application.

The present invention provides a flexible electrical interconnect cable having a transmission line structure that is capable of propagating high speed electrical signals at speeds up to (and in some cases, exceeding) 40 Gbps. Preferred practical embodiments of the flexible interconnect cable can be suitably designed to carry very high frequency electrical signals transmitted in an electro/optical data communications system. For example, such practical embodiments can be utilized for clock/data signal propagation between serializer/deserializer ("SERDES") integrated circuits and optics modules, which in turn are interfaced to optical fiber media. Such practical embodiments can be employed in synchronous optical network/synchronous digital hierarchy (SONET/SDH) (and other) applications that accommodate 10 Gbps (OC-192) and 40 Gbps (OC-768) data rates. Of course, the present invention is not limited to any particular implementation or application.

FIG. 1 and FIG. 2 depict a flexible interconnect cable 100 having a first end 102 coupled to a first component 104 and having a second end 106 coupled to a second component 108.

Figure 5:
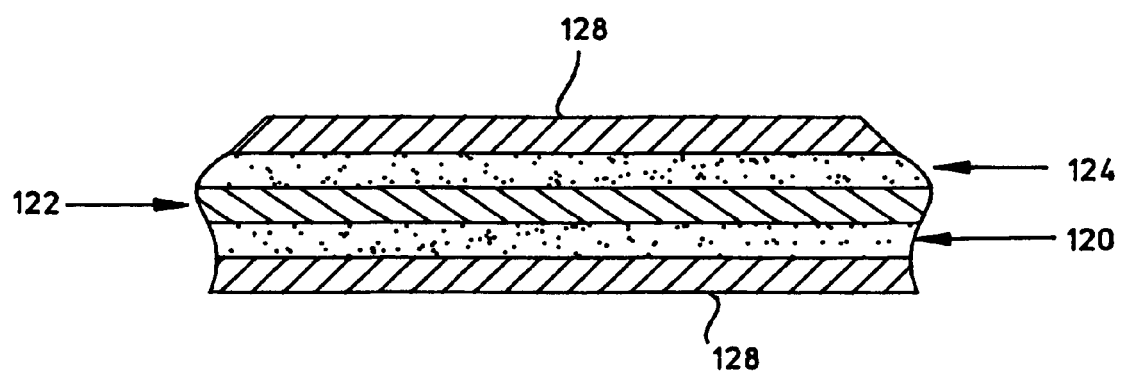
FIG. 5 is a sectional side view of a portion of the flexible interconnect cable as viewed from line B-B shown in FIG. 2.
Figure 4:
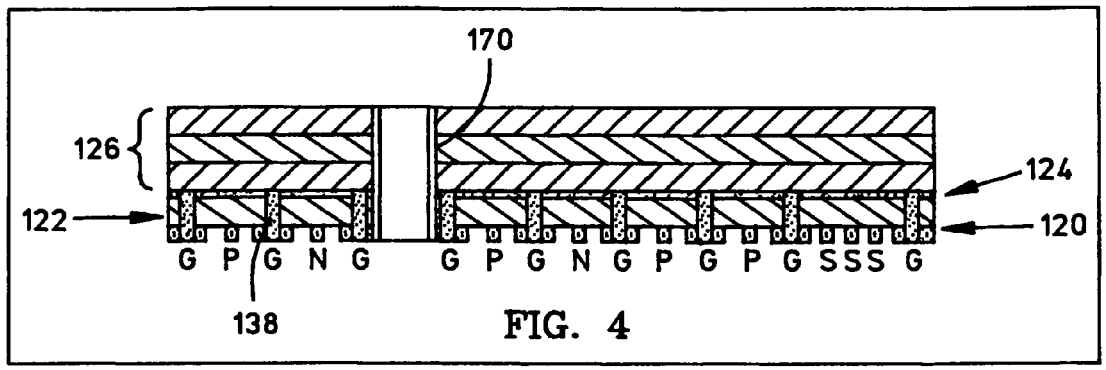
FIG. 4 is a schematic end view of the flexible interconnect cable as viewed from line A-A shown in FIG. 2.

For purposes of this example, first component 104 is an integrated circuit package comprising an electronic device (e.g., a flip chip die) 110, a component carrier substrate (e.g., a BGA substrate) 112 coupled to electronic device 110, and a cable receptacle 114 configured to receive flexible interconnect cable 100. In this example, second component 108 is an optics module comprising a component carrier substrate 116 and a cable receptacle 118 (best seen in FIG. 1). For ease of description, FIG. 1 depicts portions of first component 104 and portions of second component 108 from a sectional perspective, and FIG. 2 depicts portions of first component 104 and portions of second component 108 from a cutaway top perspective. FIG. 3 is a cutaway perspective view of a portion of the arrangement shown in FIG. 1, FIG. 4 is a schematic end view of flexible interconnect cable 100 as viewed from line A-A shown in FIG. 2, and FIG. 5 is a sectional side view of a portion of flexible interconnect cable 100 as viewed from line B-B shown in FIG. 2. The internal structure of flexible interconnect cable 100 as shown in FIG. 4 and FIG. 5 represents one preferred embodiment of the present invention. In practice, flexible interconnect cable 100 may utilize any number of different internal structures depending upon the particular application.

Referring to FIG. 4 and FIG. 5, a flexible interconnect cable according to the example embodiment generally includes a flexible conductive layer 120, a flexible dielectric layer 122, and a flexible conductive ground layer 124. As shown in FIG. 4, the cable may also include (at one or both terminating ends) a stiffening element 126 that provides structural rigidity to the end(s) of the flexible interconnect cable. In the example embodiment, stiffening element 126 comprises one or more dielectric layers coupled together (FIG. 4 shows three dielectric layers laminated together to form stiffening element 126). As shown in FIG. 5, the cable may also include an insulating jacket 128 over at least a portion of the length of the cable. In a practical embodiment, insulating jacket 128 may surround and protect the "body" of the cable while leaving the terminating ends and/or conductive pads of the cable exposed to facilitate coupling of the cable to the respective components.

Flexible dielectric layer 122 is preferably formed from a material having a low, stable, homogeneous dielectric constant ($M_r$) and a low loss tangent. For example, flexible dielectric layer 122 may be formed from polyester ($M_r$=2.7; loss tangent=0.0002), polyimide ($M_r$=3.5; loss tangent=0.007), or fluorocarbon ($M_r$=2.3; loss tangent=0.0003). The specific material chosen for dielectric layer 122 may vary from application to application, and the flexible interconnect cable may utilize any suitable material for dielectric layer 122, whether currently known or developed in the future. In a practical embodiment, the thickness of dielectric layer 122 can range between 0.002 inch to 0.020 inch. The actual thickness of dielectric layer 122 may depend upon the desired electrical characteristics, the desired transmission line impedance, and/or the desired physical characteristics (e.g., flexibility and length) of the cable. Although not shown herein, a flexible interconnect cable may utilize a nonhomogeneous dielectric layer and/or a multi-layer dielectric section in lieu of the single dielectric layer 122 shown in FIG. 4 and FIG. 5.

Flexible conductive layer 120 is coupled to flexible dielectric layer 122 using any number of known techniques. In a practical embodiment, flexible conductive layer 120 is formed by depositing or laminating a thin metal layer (having a thickness between 0.00035 inch to 0.0014 inch) onto dielectric layer 122 and etching a desired pattern into the metal layer. Flexible conductive layer 120 can be formed from any suitable conductive material such as copper, aluminum, or the like. The resulting pattern of conductive layer 120 comprises a number of conductive traces of a high-frequency electrical transmission line structure. In addition, conductive layer 120 may comprise a number of low-frequency (or DC) conductors. A number of different transmission line configurations are described in more detail below.

Flexible conductive ground layer 124 is coupled to flexible dielectric layer 122 such that flexible dielectric layer 122 resides between flexible conductive layer 120 and flexible conductive ground layer 124. Flexible conductive ground layer 124 can be formed by depositing or laminating a thin metal layer (having a thickness between 0.00035 inch to 0.0014 inch) onto dielectric layer 122 and, if necessary, etching a desired pattern into the metal layer. In the example embodiment, conductive ground layer 124 covers most, if not all, of the surface of flexible dielectric layer 122.

In a practical embodiment, the length of the flexible interconnect cable may be dependent upon a number of application-specific or technology-dependent parameters. For example, the insertion loss and group delay of the signal frequencies (or frequency) carried by the transmission line structure as a consequence of the type of dielectric materials used in the cable, the transmission line impedance of the cable, and/or the configuration of the transmission line structure may dictate a maximum length of the cable. In this regard, a typical flexible interconnect cable may have a length between two and twelve inches, depending upon the losses allowed in the system. The width of the flexible interconnect cable may also depend upon a number of practical considerations. For example, the configuration of the transmission line structure, the number of signals carried by the cable, the gap between the conductive traces, the transmission line impedance of the cable, and/or the configuration of the mating components may dictate the width of the cable body and the width of the cable ends.

The thickness of the flexible interconnect cable body may also vary according to a number of physical or electrical parameters, such as the configuration of the transmission line structure, the transmission line impedance of the cable, the number of conductive and dielectric layers, and/or the desired flexibility of the cable. In this regard, flexible conductive layer 120, flexible dielectric layer 122, flexible conductive ground layer 124, and insulating jacket 128 can be suitably configured to allow the flexible interconnect cable to achieve a minimum bend radius. In accordance with one practical embodiment, the minimum bend radius of the flexible interconnect cable is approximately three times the thickness of the cable. FIG. 1 depicts the bend radius (r) of flexible interconnect cable 100. The flexibility of the interconnect cable enables it to be twisted, bent, and routed to accommodate a number of practical component layouts and to facilitate installation and removal of the cable. The flexibility of the interconnect cable also allows it to be pre-formed during fabrication and, to a limited extent, user reformed to meet application-specific or assembly-specific configuration geometries. The flexibility of the interconnect cable eliminates the need for costly and bulky connectorized cables and adapters, and exotic substrate/board materials that may otherwise be necessary to route very high speed electrical transmission lines in some practical installations.

The various layers of the flexible interconnect cable can be coupled together using any number of conventional methodologies. As described above, a conductive layer can be deposited directly onto a dielectric layer. A plurality of layers can be laminated, glued, or otherwise affixed together to form a composite structure. After the internal layers of a flexible interconnect cable are laminated together, insulating jacket 128 can be formed around the laminated assembly using, e.g., conventional plastic extrusion techniques.

Figure 6A:
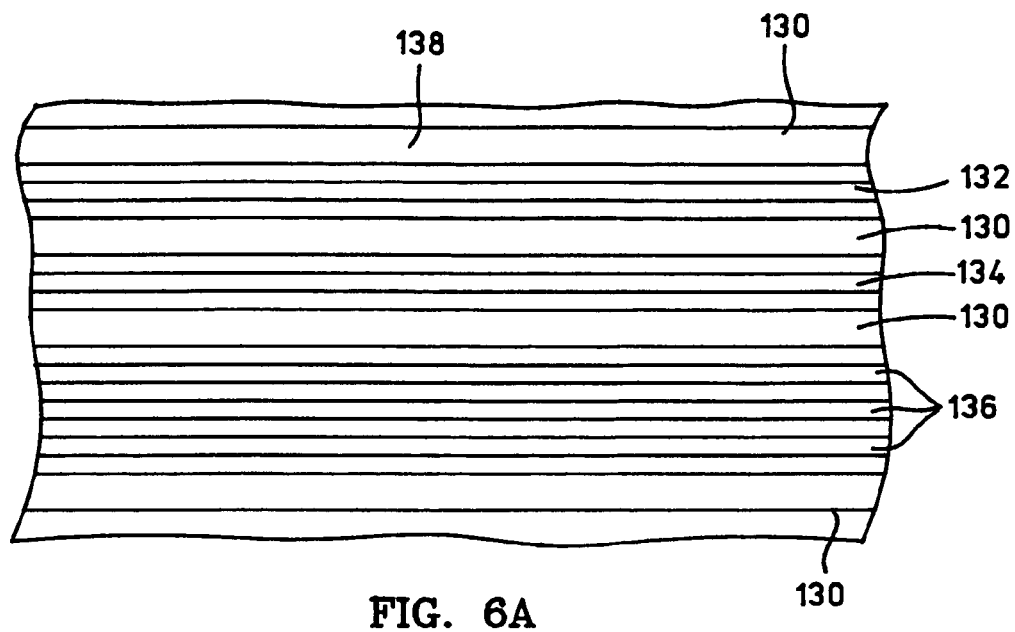
FIG. 6A is a plan view of an exposed portion of a flexible interconnect cable.

As mentioned above, a flexible interconnect cable according to the present invention includes one or more conductive layers and one or more dielectric layers that combine to form a wideband low-loss transmission line capable of propagating signals at rates that can exceed 40 Gbps. The techniques of the present invention can be utilized with a number of transmission line technologies, e.g., grounded coplanar waveguide ("GCPW"), coplanar waveguide ("CPW"), microstrip, stripline, edge/broadside coupled stripline, any known transmission line technology, and any transmission line topology that is developed in the future. For example, FIG. 4 depicts a flexible interconnect cable having a GCPW transmission line structure. FIG. 6A is a plan view of an exposed portion of a flexible interconnect cable having a GCPW structure. The GCPW structure is desirable due to its high relative velocity and minimal cross talk characteristics.

As best shown in FIG. 4 and FIG. 6A, conductive layer 120 includes a number of conductive traces that form a CPW structure, while conductive ground layer 124 forms a ground plane that cooperates with the conductive traces to form a GCPW structure. In FIG. 4, ground traces are identified by the letter "G", the first of a differential signal trace pair is identified by the letter "P", the differential complement signal trace is identified by the letter "N", and low speed serial traces are identified by the letter "S". In this example configuration, the flexible interconnect cable propagates each high speed data/clock signal as a differential signal using one "P" trace and one "N" trace. In a simple arrangement, each conductive trace follows a straight path along the length of the cable, as shown in FIG. 6A. In a practical embodiment, the conductive traces may follow curved or bent paths that may or may not follow the longitudinal axis of the cable itself. In this regard, the length of individual signal traces may vary to satisfy any number of electrical criteria including signal length matching, physical relationship (e.g., one end "P"/"N" with "N"/"P" at the other end), or the like. FIG. 6A depicts a number of conductive ground traces 130, a differential signal trace 132, a differential complement signal trace 134, and three low speed serial traces 136. In accordance with known RF and microwave design techniques and the dielectric electrical characteristics, the width of the conductive signal traces 132/134, the width of conductive ground traces 130, and the gaps between the signal and ground traces are selected to provide the desired transmission line impedance.

Although not a requirement of the invention, the flexible interconnect cable may include a number of ground vias 138 formed within dielectric layer 122. Ground vias 138 establish a conductive path between conductive ground layer 124 and ground traces 130. Vias 138 enhance the high frequency performance of the flexible interconnect cable by confining the electrical fields within dielectric layer 122 to the area between the signal trace and the respective ground trace. Otherwise, the electrical fields may extend deeper within dielectric layer 122, resulting in increased propagation delay, frequency dispersion (group delay), insertion loss, and/or crosstalk.

The use of a CPW or a GCPW transmission line structure allows the flexible interconnect cable to be easily coupled to electrical devices, components, modules, circuit boards, and/or circuit substrates (due to the coplanar nature of the signal and ground traces). For example, component carrier substrates such as BGA substrates are often designed with CPW signal input and output traces, and flip chip devices can be designed for solder connection to a flat circuit substrate having CPW signal traces formed thereon.

Figure 7:
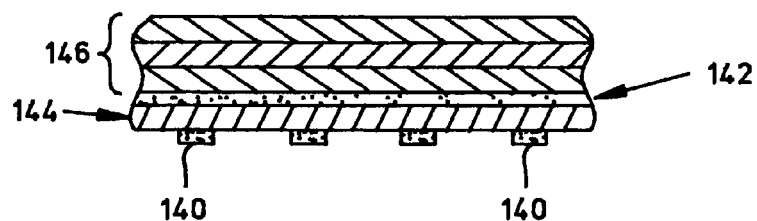
FIG. 7 is a sectional view of an alternately configured flexible interconnect cable.
Figure 8A:
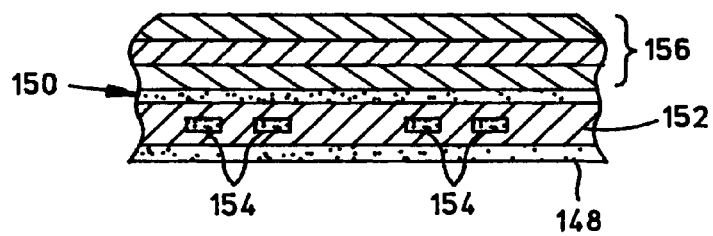
FIGS. 8A and 8B are sectional views of two alternately configured flexible interconnect cables.
Figure 8B:
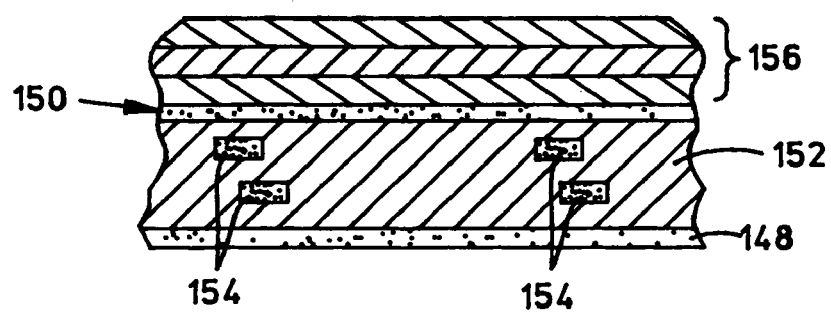

FIG. 7 is a sectional view of a flexible interconnect cable that utilizes a microstrip transmission line structure in the body of the cable, FIG. 8A is a sectional view of a flexible interconnect cable that utilizes a stripline transmission line structure in the body of the cable, and FIG. 8B is a sectional view of a flexible interconnect cable that utilizes a broadside coupled stripline structure in the body of the cable. The flexible interconnect cable shown in FIG. 7 includes a flexible conductive layer that includes a number of conductive traces 140, a flexible conductive ground layer 142, and a flexible dielectric layer 144 between the conductive layer and conductive ground layer 142. Conductive traces 140, flexible dielectric layer 144, and flexible conductive ground layer 142 combine to form the microstrip transmission line structure. The flexible interconnect cable may also include a suitably configured stiffening element 146 (e.g., a number of dielectric layers) located proximate the terminating end of the cable. As described in more detail below, stiffening element 146 provides structural rigidity to the cable end to facilitate coupling to the respective destination component.

The flexible interconnect cable shown in FIG. 8A includes a first flexible conductive ground layer 148, a second flexible conductive ground layer 150, a flexible dielectric layer 152 located between the two ground layers 148/150, and a number of conductive traces 154 embedded within flexible dielectric layer 152. Flexible ground layers 148/150, flexible dielectric layer 152, and conductive traces 154 combine to form the stripline transmission line structure. The high frequency signals propagate through the stripline transmission line via electromagnetic fields between the respective conductive signal traces and the conductive ground layers 148/150. Depending upon the proximity of the individual conductive traces, the transmission line structure may be configured as an edge coupled stripline. An edge coupled stripline arrangement may be desirable to provide a means for differential signaling, reduce the amount of electromagnetic interference emissions, provide a means of common mode rejection, and/or simply reduce the physical size of the cable. The flexible interconnect cable may also include a suitably configured stiffening element 156 (e.g., a number of dielectric layers) located proximate the terminating end of the cable. As described in more detail below, stiffening element 156 provides structural rigidity to the cable end to facilitate coupling to the respective component.

A flexible interconnect cable may alternatively employ a broadside coupled stripline structure. In contrast to the embodiment depicted in FIG. 8A, a broadside coupled stripline structure utilizes pairs of conductors that are arranged in a stacked and offset configuration within the dielectric material. FIG. 8B depicts one example embodiment of a broadside coupled stripline structure implemented in a flexible interconnect cable that includes the elements of the stripline transmission structure of FIG. 8A. Such a configuration only slightly increases the overall thickness of the cable because it adds a layer of conductive material 154 and additional dielectric material 152 to the construction of the stripline transmission structure of FIG. 8A.

The example transmission line structures shown in FIG. 7, FIG. 8A and FIG. 8B are intended to illustrate different non-CPW embodiments of the present invention. Although not shown in FIG. 7, FIG. 8A or FIG. 8B, these alternate embodiments may include any number of additional conductive traces (as shown in FIG. 4 and FIG. 6A) capable of accommodating low frequency data/control signals between components. The number of high speed conductive signal traces, the shape and size of the conductive signal traces, the thickness of the conductive and dielectric layers, and other application-specific parameters may vary in a practical embodiment.

Figure 6B:
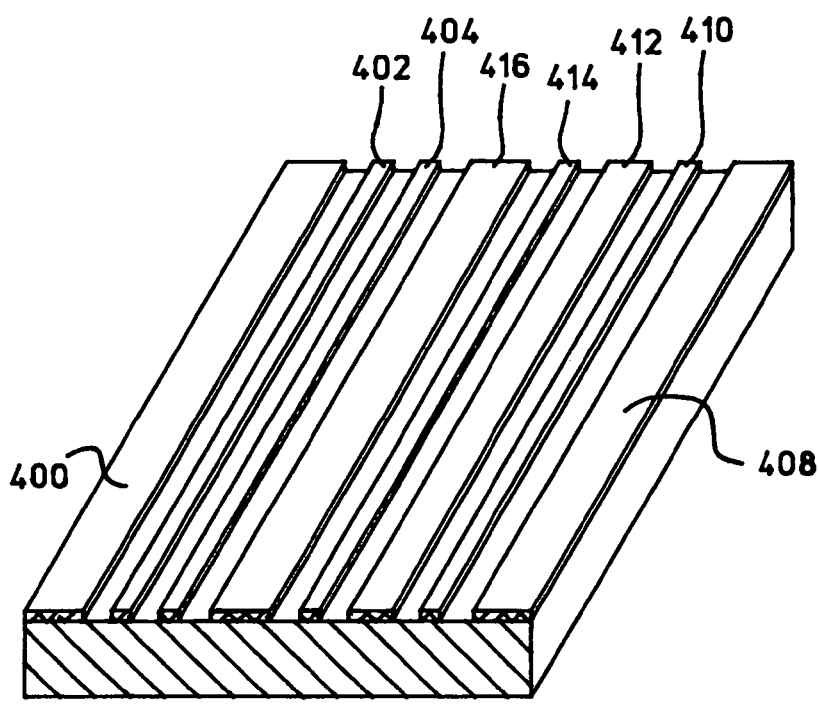
FIGS. 6B, 6C and 6D are perspective views of alternate transmission line structures that may be utilized in a flexible interconnect cable.
Figure 6C:
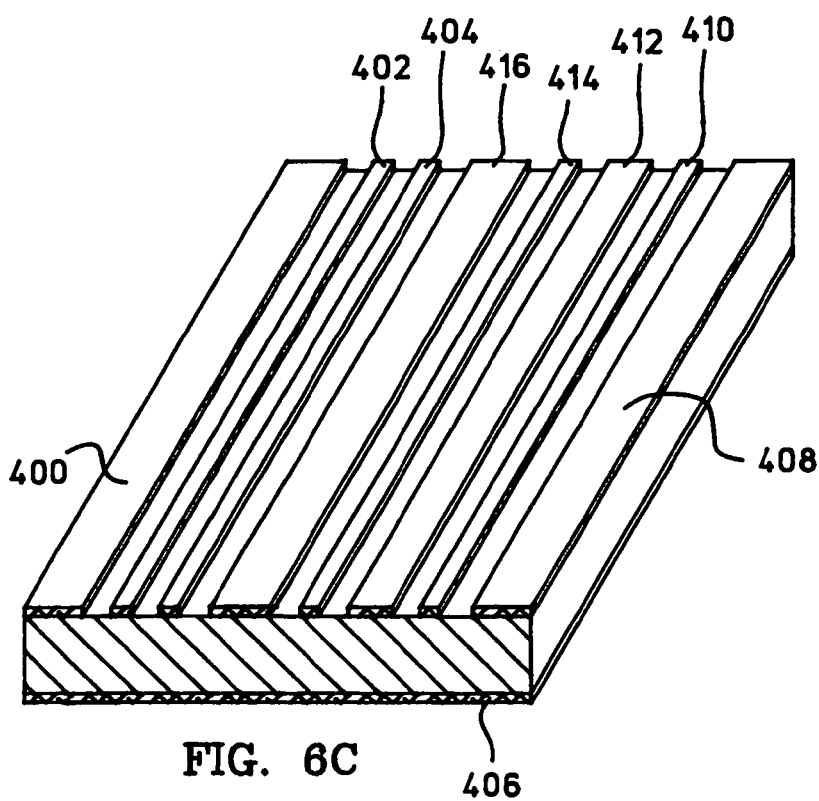

FIG. 6B and FIG. 6C depict four fundamental structures for high frequency, low loss and high noise immunity transmission lines. The transmission line structures shown in FIGS. 6B and 6C may be utilized by a flexible interconnect cable according to the present invention. In FIG. 6B, a ground conductor 400, a "P" signal conductor 402, and an "N" signal conductor 404 form a differential coplanar waveguide ("D-CPW"). In FIG. 6C, ground conductor 400, signal conductor 402, signal conductor 404 and a ground plane 406 form a differential grounded coplanar waveguide ("D-GCPW"). These two transmission line structures have several advantages over the conventional CPW and GCPW structures. In FIG. 6B, a ground conductor 408, a signal conductor 410, a ground conductor 412, a signal conductor 414, and a ground conductor 416 form a CPW structure; in FIG. 6C, ground conductor 408, signal conductor 410, ground conductor 412, signal conductor 414, ground conductor 416, and ground plane 406 form a GCPW structure. Some of these advantages include higher density of transmission lines per unit area due to the ground removal between the "P" and the "N" signal conductors, increased noise immunity due to the common mode noise cancellation, and low EM emissions due to the differential nature. In addition, coplanar structures have additional advantages over non-coplanar or GCPW and D-GCPW shown in FIG. 6C—e.g., better control of the higher order propagating modes that may interfere with the signal, vias are not required, easy integration in circuits and systems, and lenient attachment to the substrates.

Figure 6D:
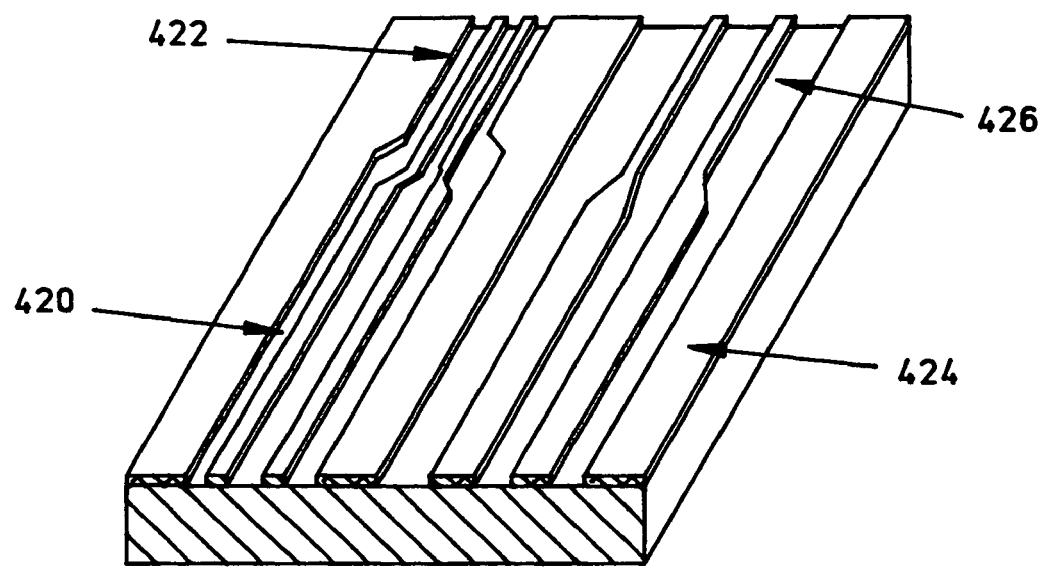

In the D-CPW and D-GCPW, the width of the conductive signal traces, the spacing between them, the distance to ground, the width of conductive ground traces, and the thickness of the conductive layer determine the even and odd impedances of the differential transmission line. These characteristics facilitate the achievement of any impedance within the fabrication limits by adjusting widths and spacing between lines and grounds only. FIG. 6D depicts this property where the impedances of transmission line sections 420 and 424 match the impedances of transmission line sections 422 and 426, despite the different relative configurations. This ability not only allows the easy interface between ICs, substrates, and modules with different pitches, pad spacing or pad size, but also minimizes the discontinuities otherwise associated with the dimensions of the transmission line.

If non-CPW transmission line structures are utilized by the flexible interconnect cable, then the terminating ends of the cable may include suitable CPW transition structures. Such transition structures (not shown) are utilized to convert the microstrip or stripline transmission line into a CPW transmission line that matches the CPW structure of the component to which the cable will be connected. Thus, for example, the cable shown in FIG. 7 may include a suitable transition circuit, formed on the conductive layer, that changes the propagation mode from microstrip to GCPW. The cable shown in FIGS. 8A and 8B may also be outfitted with CPW end structures by first transitioning inner layer signal conductors to outer layer CPW conductors using a combination of vias and properly varied/controlled conductor line widths. Each inner-to-outer conductor transition would be designed to maintain a constant impedance throughout the structure such that, end to end, the cable electrical characteristics would closely approximate a transmission line of a single construction.

The flexible interconnect cable may include an AC coupled transmission line structure (in lieu of or in addition to a DC coupled transmission line). AC capacitive coupling can be realized using the following (and other) techniques. First, conductive traces formed within the flexible interconnect cable can be DC isolated and AC coupled through one or more dielectric layers separating the conductive traces. In this regard, an AC coupled transmission line can be formed with two overlapping conductive traces having a dielectric layer therebetween. The resulting transmission line structure has no DC connectivity, yet functions as a high frequency transmission line above certain frequencies. As a second example, a general flexible interconnect cable can be designed to accommodate AC (and/or DC) coupling via resistor, capacitor, and/or other electronic components directly installed onto the cable. For example, the flexible interconnect cable may utilize a conductive trace having one or more gaps formed therein, and suitable conductive pads to which such electronic components can be connected to bridge the gaps.

The flexible interconnect cable may utilize magnetic AC coupling by overlapping transformer distributed element structures along the length of the cable. In this regard, the transformer elements may be realized by loop-shaped conductive traces or "windings" formed on different layers in the cable with very little dielectric material between the conductive traces. The conductive loops form magnetically coupled transformers that facilitate signal propagation in the absence of actual DC connectivity. The transformer windings would represent primary and secondary structures with input and output impedances that are either the same or designed to provide an impedance translation such as high to low or visa versa. Transformer structures could be used to convert single-ended signals into differential "P" and "N" compatible signal types or the reverse. Essentially all (if not a wide variety of) conventional transformer design topologies could be implemented onto a flex cable.

The configuration of the ends of the flexible interconnect cable may vary depending upon the intended installation application, and the two cable ends need not be identically configured. The ends of the cable can be designed to facilitate electrical coupling, connection, and/or contact with a compatible component, such as an electronic device, a component carrier substrate, a circuit board, a waveguide, an electronic connector, an electronic package, or the like. In this regard, an end of the flexible interconnect cable may be suitably configured to accommodate, without limitation, one or more of the following connection techniques: a compression (or press-fit) connection, a wire or ribbon bonding connection, a welded connection including those formed using ultrasonic methods, a solder ball connection, or a bonding connection including those formed using soldering methods. Furthermore, the flexible interconnect cable may be configured to establish such connections with components or devices along the body of the cable. For example, portions of the conductive traces (and/or conductive pads coupled to the conductive traces) may be exposed along the body of the flexible insulating jacket, thus facilitating coupling of electronic devices to the cable or connection of the cable to other components located between the two cable ends.

Figure 9:
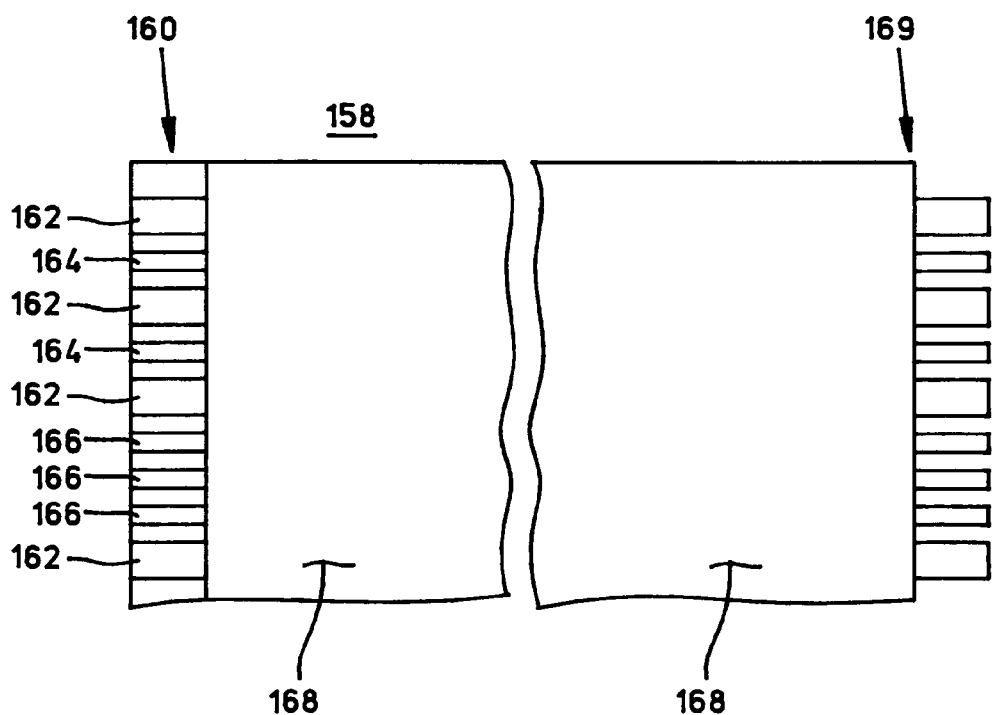
FIG. 9 is a plan view of the ends of a flexible interconnect cable.

Flexible interconnect cable 100 shown in FIGS. 1-3 is configured to form a compression connection with first component 104 and with second component 108 (FIGS. 1 and 2). More specifically, the example arrangement shown in FIGS. 1-3 includes a compression connection between first end 102 of flexible interconnect cable and component carrier substrate 112, and a compression connection between second end 106 of flexible interconnect cable and component carrier substrate 116 as shown in FIG. 1 & 2. In accordance with one practical embodiment, each of the conductive traces formed by flexible conductive layer 120 (see FIG. 4) terminates at an exposed conductive pad located proximate a terminating end of the cable. In this regard, FIG. 9 is a plan view of two ends of a flexible interconnect cable 158. A first end 160 of cable 158 includes a number of exposed conductive ground pads 162 corresponding to conductive ground traces formed within cable 158, a number of exposed conductive signal pads 164 corresponding to conductive signal traces formed within cable 158, and a number of exposed conductive pads 166 corresponding to low-speed conductors formed within cable 158.

The first end 160 of cable 158 shown in FIG. 9 represents a configuration suitable for use in the arrangement shown in FIGS. 1-3. As seen in FIG. 9, an insulating jacket 168 (e.g., see FIG. 9) terminates before the end of the cable 158 such that the conductive pads are exposed. The conductive pads are exposed on one side, while the opposite side remains coupled to the adjacent dielectric layer. As shown in FIG. 4, stiffening element 126 is located above the conductive pads. Stiffening element 126 provides mechanical support that tolerates the compressive force necessary to hold cable 158 against the respective component. In this example configuration, the "connector" portion of cable 158 is formed from the same laminate materials as the cable itself, and the "connector" end is an extension of the main cable body.

The second end 169 of cable 158 represents an alternate configuration where a portion of the conductive traces (or conductive pads connected to the traces) are fully exposed, thus forming a number of tabs extending from the tip of cable 158. The different cable connection schemes described herein can apply to either configuration shown in FIG. 9.

Referring to FIG. 3, cable receptacle 114 may be a compression connector configured to hold flexible interconnect cable 100 against component carrier substrate 112 to form a compression connection between the exposed conductive pads of cable 100 and a number of conductive substrate pads (not shown) formed on component carrier substrate 112. In this regard, the substrate pads on component carrier substrate 112 correspond to the exposed conductive pads of cable 100 (in the preferred embodiment, component carrier substrate 112 includes CPW or, optionally, GCPW transmission line traces that end at the substrate pads). In a practical embodiment, the carrier substrate "connector" is formed in part by the same substrate material to which electronic device 110 is attached. The installation of flexible interconnect cable 100 into cable receptacle 114 establishes electrical contact between the exposed conductive pads of cable 100 and the conductive pads of substrate 112. In practical embodiments, the conductive pads of cable 100 are sized and shaped to match the corresponding conductive pads of component carrier substrate 112. Thus, the transmission line of flexible interconnect cable 100 matches the transmission line of component carrier substrate 112 when cable 100 is properly aligned with carrier substrate 112, thus forming a low-loss connection with very little impedance mismatching (return loss).

Cable receptacle 114 may utilize one or more springs, clips, tension elements, screws, fasteners, hinges, sliding elements, or other devices to create a uniform compressive force for holding flexible interconnect cable 100 against component carrier substrate 112. In one practical embodiment, cable receptacle 114 receives the respective end of cable 100 and, after engagement of a locking mechanism, cable 100 becomes coupled to carrier substrate 112. Flexible interconnect cable 100, cable receptacle 114, and/or the component to which cable 100 is attached may include features that promote proper installation of cable 100. For example, as shown in FIG. 2 and FIG. 4, cable 100 may include one or more keyways 170 that engage with corresponding features of the interconnected components. Keyways 170 ensure that the ends of flexible interconnect cable 100 are connected to the appropriate components and that the conductive traces of cable 100 are properly aligned with the corresponding traces of the interconnected components. Flexible interconnect cable 100, cable receptacle 114, and/or other elements of the interconnected components may include structural features (e.g., ridges, shoulders, posts, or walls) that serve as alignment guides for the installation of cable 100.

In lieu of the compression connection technique, the conductive traces of a flexible interconnect cable can be electrically bonded to the corresponding conductive pads formed on the interconnected component. For example, FIG. 10 is a cutaway top view of an integrated circuit package 172 having a carrier substrate compatible with a flexible interconnect cable. FIG. 10 depicts package 172 with the lid removed; the edge of the lid is represented by the dashed line. FIG. 11 is a side view of integrated circuit package 172 with a flexible interconnect cable 174 coupled thereto. Package 172 includes an electronic device 176 (e.g., a flip chip die) mounted to a component carrier substrate 178 (e.g., a BGA substrate). As shown in FIG. 10, substrate 178 can be extended beyond the edge of the device lid to expose signal connection points, including high speed transmission lines and other conductive traces as required by the specific application. These conductive traces preferably terminate at conductive substrate pads 180 that match the corresponding connection points on flexible interconnect cable 174.

As shown in FIG. 11, flexible interconnect cable 174 can be directly bonded, soldered, or otherwise conductively attached to component carrier substrate 178 to form an electrical connection between the component carrier traces and the cable traces. The electrical bonding establishes electrical signal paths from component carrier substrate 178 to cable 174. In a practical implementation where cable 174 will not be physically stressed or moved after installation, conventional soldering can provide an adequate physical and electrical connection.

Figure 12:
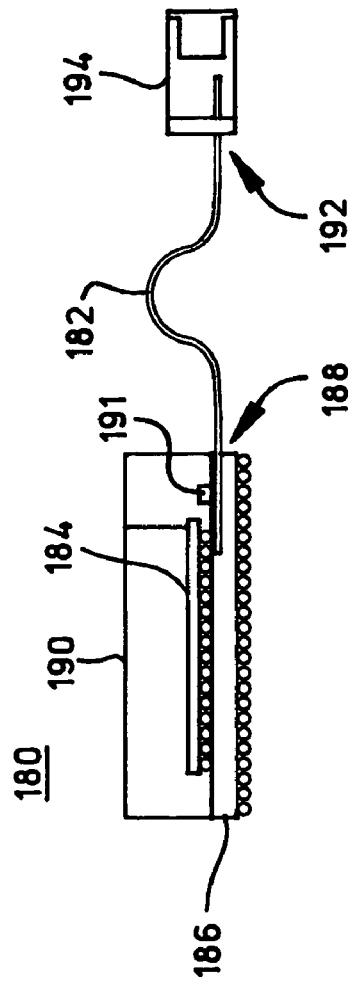
FIG. 12 is a side view of an integrated circuit package connected to a flexible interconnect cable using alternate connection techniques.
Figure 13:
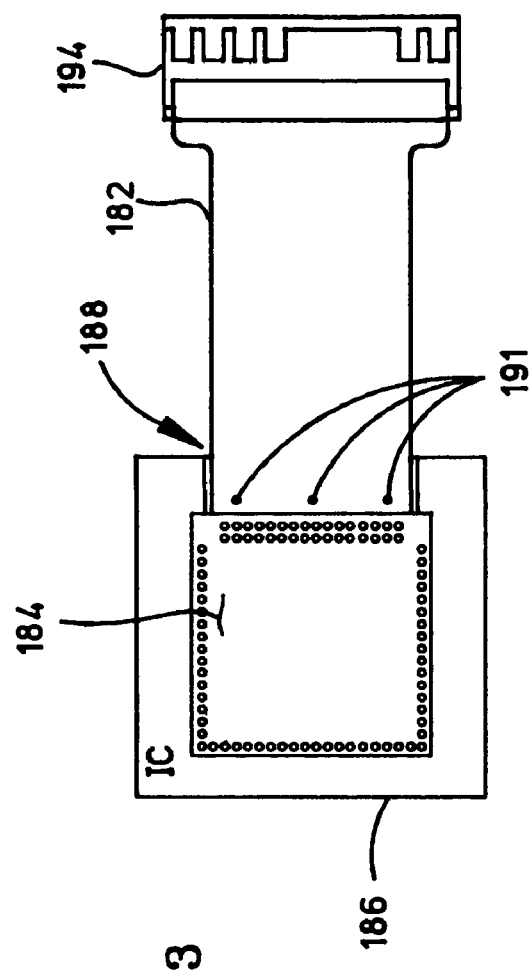
FIG. 13 is a cutaway top view of the arrangement shown in FIG. 12.

FIG. 12 is a side view of an integrated circuit package 180 connected to a flexible interconnect cable 182 using alternate connection techniques, and FIG. 13 is a cutaway top view of the arrangement shown in FIG. 12. Package 180 generally includes an electronic device 184 (e.g., a flip chip die) and a component carrier substrate 186 (e.g., a BGA substrate). As shown, electronic device 184 is mounted to both carrier substrate 186 and to a first end 188 of cable 182. In a practical flip chip embodiment, some of the flip chip solder balls are coupled to conductive pads (not shown) formed on the upper surface of carrier substrate 186, while some of the flip chip solder balls are coupled to corresponding conductive pads (obscured from view in FIG. 13) on cable 182. Accordingly, the exposed conductive pads (which may be constructed in the same manner as the pads shown in FIG. 9) of cable 182 are suitably configured to facilitate electrical bonding to corresponding solder balls formed on electronic device 184.

In accordance with conventional packaging techniques, carrier substrate 186 includes traces and vias for establishing electrical conductivity between the flip chip terminals and the solder balls on the lower surface of carrier substrate 186. High speed signals to and from electronic device 184 are preferably carried by cable 182. Consequently, the layout and terminals of electronic device 184, the configuration of package 180, and cable 182 can be cooperatively designed to facilitate a compliant assembly.

Integrated circuit package 180 and/or flexible interconnect cable 182 may include any number of features designed to mechanically attach or stabilize cable 182 to package 180. Such features may provide stress relief for the connection between cable 182 and electronic device 184. For example, as depicted in FIG. 12, package 180 may be designed such that first end 188 of cable is sandwiched and held between a package lid 190 and component carrier substrate 186. In addition, cable 182 may have a number of holes formed therein (positioned such that they do not affect the electrical characteristics of the transmission line structure) for receiving mounting/alignment pins 191 located on package 180. Cable 182 and/or package 180 may utilize any number of additional or alternative coupling methodologies to form a mechanically sound junction.

As mentioned above, the end configuration of the flexible interconnect cable may be dictated by the intended application or installation. For example, a second end 192 of cable 182 is provisioned with an optics module connector 194 designed for compatibility with a particular optics module (not shown). Thus, a practical subassembly including integrated circuit package 180 and attached cable 182 can be manufactured and made available for installation at the subsystem or system level. Alternatively, one or more ends of cable 182 (and other cables described herein) can be terminated with any conventional, custom, or semi-custom connector configured to form an electronic and/or mechanical connection with the end component, module, or device. For example, a flexible interconnect cable may be terminated with an Anritsu V® connector, an SMA (subminiature version A) connector, a Gilbert GPPO™ connector, or the like.

Figure 14:
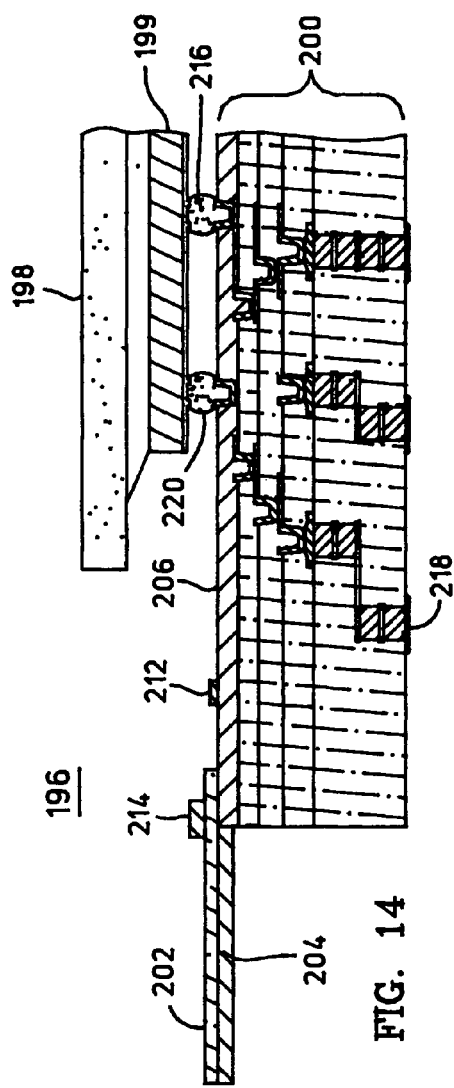
FIG. 14 is a side view of an assembly including an electronic device, a circuit substrate, and a flexible interconnect cable.

FIG. 14 is a side view of an assembly 196 including an electronic package 198, a circuit substrate 200, and a flexible interconnect cable 202. Electronic package 198 represents a flip chip package including a flip chip die 199. Cable 202 is coupled to circuit substrate 200 utilizing yet another alternate connection methodology. Briefly, one or more conductive pads (connected to or integrated with respective conductive traces 204) of cable 202 are electrically bonded to corresponding conductive pads (connected to or integrated with respective conductive traces 206) formed on the surface of circuit substrate 200. In this example embodiment, the end of cable 202 may be similar to end 169 of flexible interconnect cable 158 (see FIG. 9), i.e., conductive traces 204 may terminate at exposed conductive tabs that facilitate conductive bonding, soldering, welding, or other electrical coupling to the respective conductive pads on circuit substrate 200. In this example, conductive traces 204 are formed on a single conductive layer sandwiched between two dielectric or insulating layers.

Figure 15:
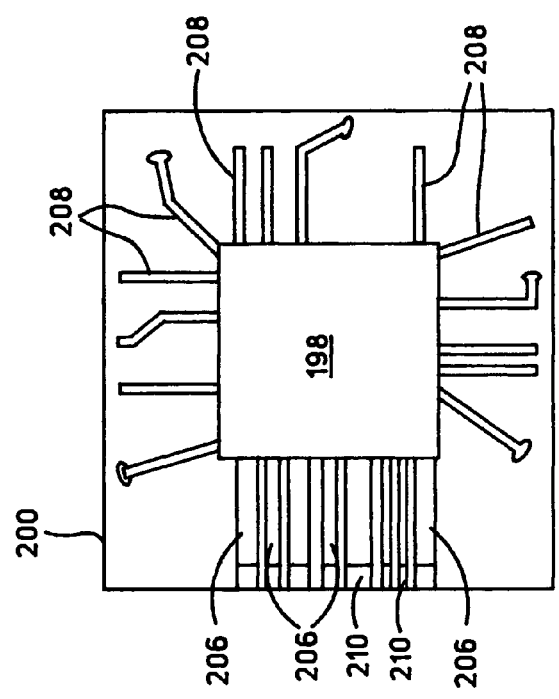
FIG. 15 is a plan view of a circuit substrate suitable for use in the assembly shown in FIG. 14.

FIG. 15 is a plan view of circuit substrate 200, which includes an example layout of conductive traces 206, along with a number of additional conductive traces 208 that need not be coupled to flexible interconnect cable 202. In this example, the terminating ends of conductive traces 206 form conductive pads 210. In the preferred practical embodiment, the conductive pads/tabs of flexible interconnect cable 202 are formed from the same material as conductive traces 204, and the conductive pads/tabs are configured to match the size, shape, and layout of conductive pads 210 located on circuit substrate 200.

In the preferred embodiment, conductive traces 204 are ultrasonically welded to conductive pads 210 to establish electrical contact between the flexible interconnect cable 202 and circuit substrate 200. As shown in FIG. 14, ultrasonic welds 212 can be formed on each of the conductive traces 204 utilizing conventional ultrasonic welding techniques. In a practical embodiment, gold (or other conductive material) plating on the conductive pads 210 and/or conductive traces 204 forms the ultrasonic welds during the ultrasonic welding process. Assembly 196 may employ mechanical features 214 (e.g., screws, tabs, posts, compression elements, plugs, or the like) to strengthen the physical connection between flexible interconnect cable 202 and circuit substrate 200.

In the example embodiment, circuit substrate 200 comprises an organic, LTCC, HTCC, or alumina multi-layer BGA substrate and electronic package 198 comprises a flip chip die. As shown in FIG. 14, circuit substrate 200 may include a suitable interconnect arrangement that provides conductive paths from solder balls 216 associated with electronic package 198 to solder balls (or conductive pads) 218 associated with circuit substrate 200. In a practical embodiment, the conductive paths through circuit substrate 200 can be utilized for relatively low speed signals and DC connections, while conductive traces 206 can be utilized for relatively high speed signals that require a high frequency transmission line structure for propagation. In this regard, FIG. 14 shows a flip chip solder ball 220 connected directly to at least one conductive trace 206.

Figure 16:
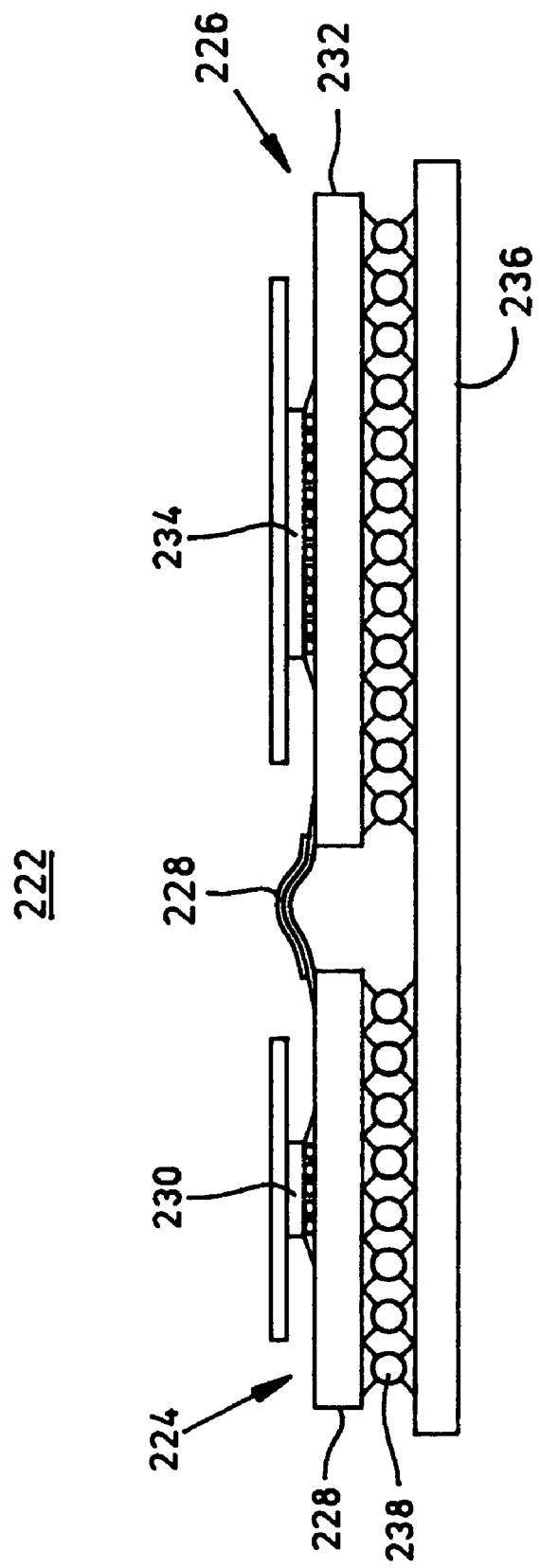
FIG. 16 is a side view of an assembly including two electronic components connected by a flexible interconnect cable.

FIG. 16 is a side view of an assembly 222 including two electronic components 224/226 connected by a flexible interconnect cable 228. FIG. 16 depicts an arrangement whereby component 224 and component 226 are coupled together by directly bonding conductive tabs or traces of cable 228 to corresponding conductive pads or traces located on components 224/226. As described above, component 224 may include a component carrier substrate 228 having conductive pads formed on the same surface to which an electronic device 230 is mounted. Likewise, component 226 may comprise a component carrier substrate 232 having conductive pads formed on the same surface to which an electronic device 234 is mounted. In a typical subsystem or system environment, components 224/226 can each be mounted to a suitable circuit board (or card) 236 using solder balls 238 or other conductive connections. The configuration of flexible interconnect cable 228 and/or carrier substrates 228/232 allows cable 228 to be easily installed after components 224/226 are mounted to circuit board 236.

Figure 17:
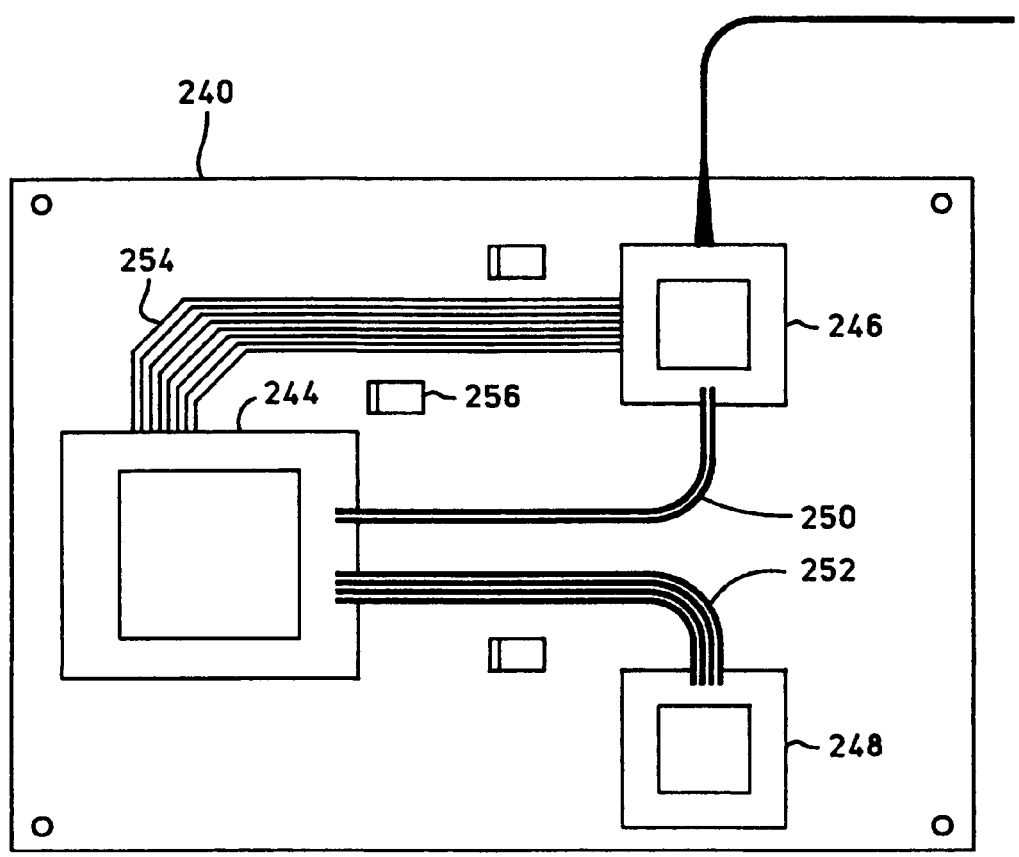
FIG. 17 is a plan view of a circuit board including a number of electronic components connected by a flexible interconnect cable.

FIG. 17 is a top plan view of an example circuit board 240 including a number of electronic components connected by a flexible interconnect cable 242. In this example, cable 242 is coupled to a first component 244, a second component 246, and a third component 248 using the "direct substrate" attachment technique described above in connection with FIG. 14. FIG. 17 illustrates how a single flexible interconnect cable 242 can be employed to establish a plurality of transmission line structures between different assembly components. In this regard, a first transmission line structure 250 couples first component 244 to second component 246, while a second transmission line structure 252 couples first component 244 to third component 248. In this example, circuit board 240, which may be formed in accordance with conventional techniques (e.g., circuit board 240 may be an FR-4 board), includes a number of board-mounted low speed signal traces 254 between first component 244 and second component 246 and a number of board-mounted electronic components 256 (e.g., resistors, capacitors, diodes, inductors, or the like) that may be interconnected or connected to components 244/246/248 using conventional circuit board interconnect techniques. Thus, low cost interconnect techniques can be utilized for low speed and DC connections, while high speed (e.g., up to 50 Gbps) signals can be propagated by flexible interconnect cable 242.

Conventional high speed (10-40 Gbps) BGA interconnect solutions exhibit relatively high insertion loss, high electromagnetic radiation, and low impedance control. Furthermore, due to the complex internal interconnect structure of BGA substrates, extensive three-dimensional microwave simulations are necessary to characterize the electrical performance of the substrates—such simulations are very costly and time consuming. In addition, the discrete number of practical BGA solder ball sizes and pitches makes it difficult to optimize the design of the electronic device and/or the BGA substrate to which the electronic device is coupled. If, however, a flexible interconnect cable is utilized to carry the high speed signals between the electronic circuit and the BGA substrate, then a relatively straightforward two-dimensional simulation model can be utilized to design the subassembly.

Although the benefits of the present invention are best realized when the flexible interconnect cable is utilized to carry very high speed signals (e.g., 10-40 Gbps), the connection technique described above in connection with FIG. 14 need not be limited or restricted to very high speed applications. Indeed, low speed applications can also employ flexible interconnect cables having flexible conductive traces that are directly coupled to a component carrier substrate.

Figure 18:
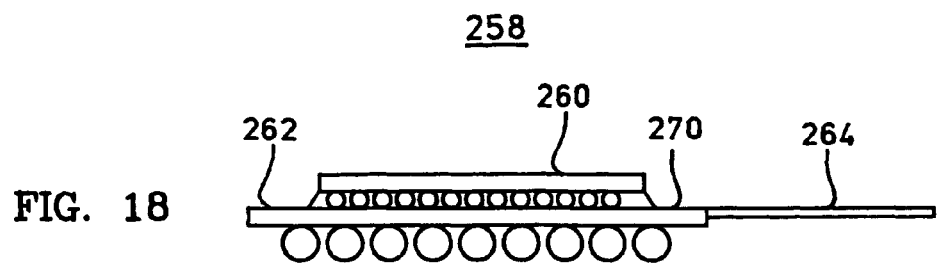
FIG. 18 is a side view of an assembly including an electronic device mounted to a circuit substrate.
Figure 19:
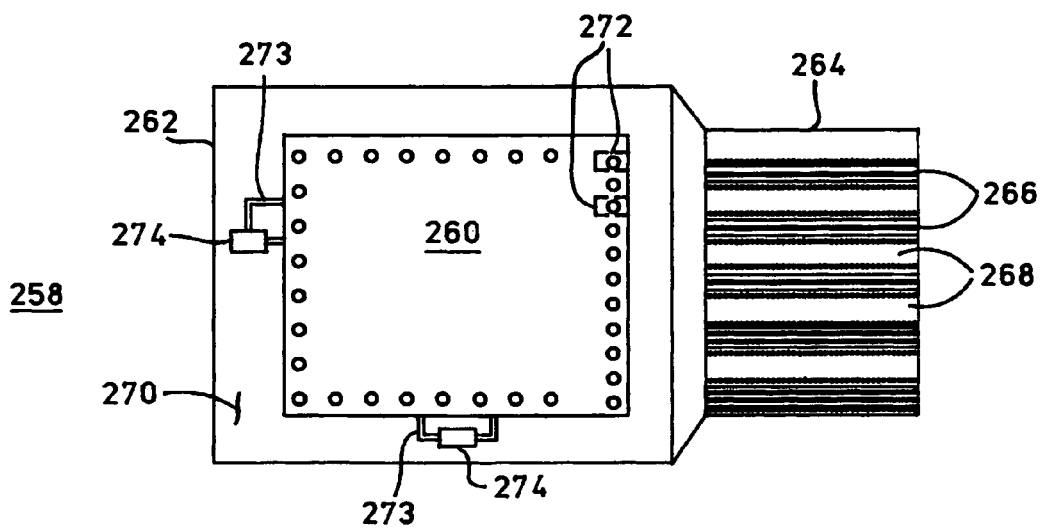
FIG. 19 is a plan view of the assembly shown in FIG. 18.

A flexible interconnect cable according to the present invention can also be fabricated to extend the stiffening element into a component carrier substrate to form an interconnect assembly for an electronic device. In this regard, FIG. 18 is a side view of an assembly 258 including an electronic device 260 mounted to a circuit substrate 262 and underfilled, and FIG. 19 is a plan view of assembly 258. Assembly 258 also includes a flexible interconnect cable 264 that is integrated with circuit substrate 262; cable 264 is preferably configured in accordance with the flexible cable techniques described herein. In the preferred practical embodiment, electronic device 260 is a flip chip die and circuit substrate 262 is a rigid/flex BGA substrate. Solder balls formed on electronic device 260 establish electrical contact with corresponding conductive pads formed on the upper surface of circuit substrate 262. In turn, BGA solder balls formed on the lower surface of circuit substrate 262 establish electrical contact with corresponding conductive pads formed on a circuit board, a card, or other component. Thus, circuit substrate 262 can include a suitably configured interconnect structure (comprising, e.g., one or more conductive layers, one or more dielectric layers, and a number of interconnect vias) that provides conductive paths from electronic device 260 to the BGA balls. High speed signals (and possibly other signals) can be transmitted over cable 264, thus eliminating the need to design high speed interconnects that pass completely through or into circuit substrate 262. In the preferred practical embodiment, all high speed signals propagate only along surface conductors of the rigid/flex substrate. Although not shown in FIG. 18 or FIG. 19, the opposite end of cable 264 can be suitably configured for coupling to another component such as an electronic device, a functional module, a circuit board, a waveguide, a component carrier substrate, or the like.

In the preferred practical embodiment shown in FIG. 19, one or more layers of flexible interconnect cable 264 are also utilized as layer(s) of circuit substrate 262. For example, a conductive layer of cable 264, which may include a number of conductive signal traces 266 and/or a number of conductive ground traces 268 as shown in FIG. 19, can extend within or onto circuit substrate 262, thus forming a conductive layer of circuit substrate 262. In a GCPW embodiment, cable 264 also includes a conductive ground layer and an intervening dielectric layer, each of which extends within circuit substrate 262. In a practical embodiment, circuit substrate 262 comprises a number of circuit substrate conductive layers interspersed between a number of circuit substrate dielectric layers, where one (or more) circuit substrate conductive layer is the same conductive layer in cable 264, and where one (or more) circuit substrate dielectric layer is the same dielectric layer in cable 264.

Continuing with the description of FIG. 19, circuit substrate 262 includes a device-mounting surface 270 upon which one or more conductive substrate traces (obscured from view in FIG. 19) are formed. As a result of the integrated construction of assembly 258, the conductive traces of flexible interconnect cable 264 form a number of the conductive substrate traces. The conductive traces terminate at exposed conductive pads 272 (depicted in FIG. 19 by dashed lines) configured to facilitate electrical bonding to a corresponding solder ball formed on electronic device 260. Device-mounting surface 270 may also include any number of conductive traces 273 that accommodate the mounting of discrete components 274 directly onto circuit substrate 262 as shown in FIG. 19. These conductive traces 273 can be electrically coupled to the conductive traces of cable 264, to solder balls, and/or to interconnect elements (such as blind vias) of circuit substrate 262 as shown in FIG. 19.

The combined circuit substrate 262 and flexible interconnect cable 264 can be manufactured in accordance with conventional deposition, etching, laminating, and bonding techniques. The layers of cable 264 form a foundation upon which circuit substrate 262 is formed. In a practical CPW embodiment, a conductive layer of cable 264 can serve as the initial layer of circuit substrate 262, and a dielectric layer of cable 264 can serve as device-mounting surface 270 of circuit substrate 262. Additional dielectric and/or conductive layers of circuit substrate 262 can be formed thereafter. One preferred embodiment utilizes known rigid/flex substrate technologies to form circuit substrate 262. Alternate embodiments may utilize other suitable circuit substrate or circuit board technologies.

Figure 20:
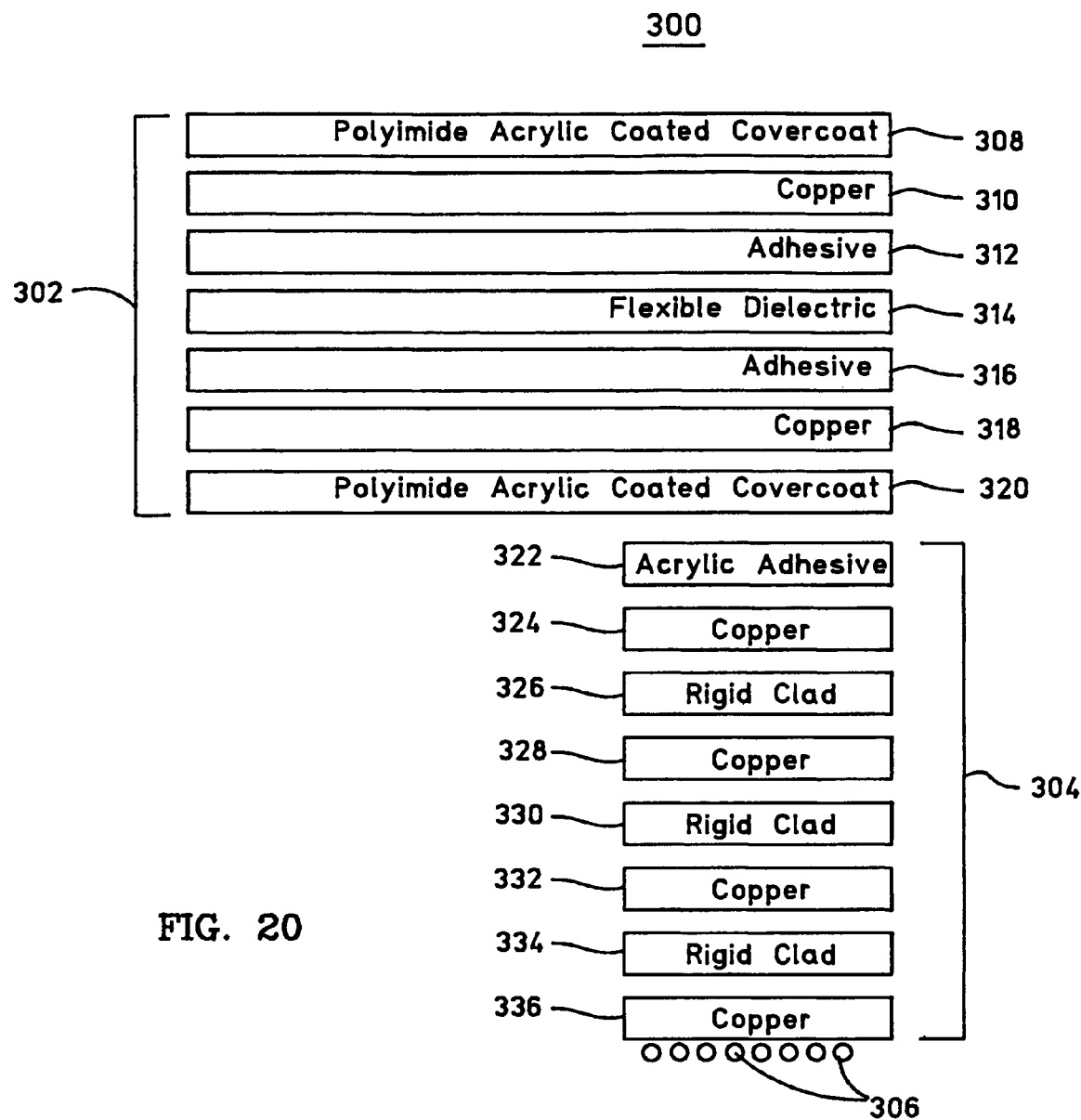
FIG. 20 is a stack-up diagram representing material layers in an example flexible interconnect cable suitable for use in the assembly shown in FIG. 18 and FIG. 19.

FIG. 20 is a stack-up diagram representing material layers in an example flexible interconnect cable 300 suitable for use in the assembly shown in FIG. 18 and FIG. 19. The stack-up diagram (which is not to scale) depicts a cross section of cable 300 that includes different layers that may be found in cable 300. In a practical embodiment, the cross sectional configuration may vary along the length and/or width of cable 300. For example, FIG. 20 does not depict conductive vias or conductive trace patterns that may be formed in any given conductive layer.

Flexible interconnect cable 300 includes a cable section 302 coupled to a rigid base section 304. Cable section 302 may include any of the flexible interconnect cable structures described above, and rigid base section 304 can employ conventional technologies to provide a mounting base for cable section 302. In the example embodiment, rigid base section 304 is configured in accordance with known BGA specifications. In this regard, rigid base section 304 includes a number of BGA solder balls 306 that represent conductive connection points associated with conductive traces and/or conductive vias formed in cable section 302.

Cable section 302 may include an upper covercoat or insulation layer 308, a first conductive layer 310, a first adhesive layer 312, a flexible dielectric layer 314, a second adhesive layer 316, a second conductive layer 318, and a lower covercoat or insulation layer 320. Upper and lower covercoat layers 308/320 form an outer insulating cover for cable section 302. In the example embodiment, covercoat layers 308/320 are formed from a suitable polyimide material. As described in detail above, conductive layers 310/318 and dielectric layer 314 form a sandwich construction such that conductive traces formed in the conductive layers 310/318 provide a high frequency transmission line structure. In a practical embodiment, conductive layers 310/318 are copper layers. Adhesive layers 312/316 utilize a suitable adhesive material that bonds conductive layers 310/318 to dielectric layer 314 while preserving the desired electrical characteristics of the transmission line structure.

Rigid base section 304 may include an acrylic adhesive layer 322, a first conductive layer 324, a first rigid clad layer 326, a second conductive layer 328, a second rigid clad layer 330, a third conductive layer 332, a third rigid clad layer 334, a fourth conductive layer 336, and BGA balls 306. Adhesive layer 322, which may comprise an acrylic adhesive, physically couples cable section 302 to rigid base section 304. Rigid base section 304 may include any number of conductive layers (four conductive layers are depicted in FIG. 20), e.g., copper layers, that form a suitable interconnect arrangement. As shown in FIG. 20, conductive layers 324/328/332/336 alternate with rigid clad layers 326/330/334 to form a sandwich construction. Rigid clad layers 326/330/334 insulate the respective conductive layers from each other and provide structural support to rigid base section 304. Rigid clad layers 326/330/334 represent FR-4 dielectric layers in one example embodiment. In this manner, flexible cable section 302 is terminated at rigid base section 304, which is configured for mounting to a circuit board, another substrate, or the like.

Assembly 258 can leverage relatively low cost substrate technologies while providing high speed interconnect cabling. The integrated nature of flexible interconnect cable 264 eliminates the need for high speed connector devices and high speed interconnect transitions from electronic device 260 through circuit substrate 262. A circuit substrate with an integrated flexible interconnect cable may also be designed to accommodate any number of discrete components, flip chips, and devices (in contrast to the single-device version shown in FIG. 18 and FIG. 19). In addition, the integrated flexible interconnect cable can be routed to any number of destination components (as in the example shown in FIG. 17). The assembly can also be manufactured with one or more flexible interconnect cable sections devoted to the testing of internal points that would otherwise be inaccessible. After such testing, the respective sections of the flexible interconnect cable can be sheared off to restrict customer access to the internal test points.

In summary, a flexible interconnect cable configured in accordance with the present invention is capable of carrying very high speed data/clock signals (e.g., 40 Gbps and higher). The cable is a multi-layered construction that includes at least one flexible conductive layer coupled to at least one flexible dielectric layer. Conductive signal traces are located on the at least one conductive layer; the conductive signal traces and the at least one dielectric layer combine to form a high frequency (e.g., RF or microwave) electrical transmission line structure. The flexible interconnect cable can be terminated using a number of different methodologies. At least the following connection technologies are contemplated: a compression connection between the cable and a component carrier substrate; electrical bonding of the cable to a component carrier substrate; electrical bonding of the cable to an electronic device; "standard" connectors attached to the end of the cable; and integration of the cable with a component carrier substrate.

The flexible interconnect cable provides a relatively low cost means to interconnect very high speed electrical components, such as those commonly used in electro-optical communication systems. The cable enables designers to utilize conventional circuit substrate technologies (e.g., printed circuit boards and rigid BGA substrates) for relatively low speed signals, while routing the high speed signals over the flexible cable transmission line. In this manner, the three-dimensional design problem for a high speed substrate interconnect can be simplified into a more manageable two-dimensional model from behavioral simulation through first time design success. Furthermore, use of the flexible interconnect cable can reduce the number of high frequency transitions from the electronic circuit to the destination component, thus improving the integrity of the propagated signal by adding planarity to the signal path.

The present invention has been described above with reference to a number of preferred embodiments. However, those skilled in the art having read this disclosure will recognize that changes and modifications may be made to the preferred embodiments without departing from the scope of the present invention. These and other changes or modifications are intended to be included within the scope of the present invention, as expressed in the following claims.

The invention claimed is:

1. An electronic assembly comprising:
a flexible interconnect cable with first and second terminating ends, the flexible interconnect cable including:
a flexible dielectric layer;
a flexible conductive layer mounted to a first side of the flexible dielectric layer;
a plurality of conductive traces on the flexible conductive layer;
the conductive traces including signal and ground conductive traces;
the signal and ground conductive traces defining at least one wideband low-loss transmission means for propagating signals at a rate exceeding 10 Gigabits/second ("Gbps");
a flexible ground layer mounted to a second side of the flexible dielectric layer;
a plurality of conductive cable pads at the first terminating end, each conductive cable pad terminating a respective conductive trace;
a component carrier substrate with conductive pads;
an electronic device on the component carrier substrate, the electronic device including solder balls, a first plurality of said solder balls connected to the conductive pads on the component carrier substrate and also connectable to the conductive cable pad at the first terminating end, and a second plurality of solder balls connected to the conductive cable pads at the first terminating end and also connectable to the conductive pads on the component carrier substrate; and,
a module connector connected to the second terminating end.

2. The electronic assembly of claim 1, a first wideband low-loss transmission means for propagating signals including at least one coplanar waveguide.

3. The electronic assembly of claim 2, the signal and ground conductive traces also defining a differential signal trace pair and a low speed serial signal trace.

4. The electronic assembly of claim 1, a first wideband low-loss transmission means for propagating signals including at least one grounded coplanar waveguide.

5. The electronic assembly of claim 4, the signal and ground conductive traces also defining a differential signal trace pair and a low speed serial signal trace.

6. The electronic assembly of claim 1, a first wideband low-loss transmission means for propagating signals including a one coplanar waveguide for propagating signals including at a rate exceeding 40 Gbps.

7. The electronic assembly of claim 6, the signal and ground conductive traces also defining a differential signal trace pair and a low speed serial signal trace.

8. The electronic assembly of claim 1, further comprising a stiffening element on the flexible ground layer.

9. The electronic assembly of claim 1, further including a plurality of alignment pins on the component carrier substrate and a plurality of holes in the first terminating end receiving the plurality of alignment pins.

10. The electronic assembly of claim 1, wherein the module connector is an optics module connector or an SMA (subminiature version A) connector.

11. The electronic assembly of claim 1, wherein the electronic device is a flip chip die and the component carrier substrate is a ball grid array substrate.

12. The electronic assembly of claim 11, a first wideband low-loss transmission means for propagating signals including at least one coplanar waveguide.

13. The electronic assembly of claim 12, the signal and ground conductive traces also defining a differential signal trace pair and a low speed serial signal trace.

14. The electronic assembly of claim 11, a first wideband low-loss transmission means for propagating signals including at least one grounded coplanar waveguide.

15. The electronic assembly of claim 14, the signal and ground conductive traces also defining a differential signal trace pair and a low speed serial signal trace.

16. The electronic assembly of claim 11, a first wideband low-loss transmission means for propagating signals including a one coplanar waveguide for propagating signals including at a rate exceeding 40 Gbps.

17. The electronic assembly of claim 16, the signal and ground conductive traces also defining a differential signal trace pair and a low speed serial signal trace.

18. An electronic assembly comprising:
a flexible interconnect cable with first and second terminating ends, the flexible interconnect cable including:
a flexible dielectric layer with first and second sides;
a plurality of conductive traces on the first side;
the conductive traces including signal and ground conductive traces;
the signal and ground conductive traces defining at least one wideband low-loss transmission means for propagating signals at a rate exceeding 10 Gigabits/second ("Gbps");
a flexible ground layer mounted to the second side;
a plurality of conductive cable pads at the first terminating end, each conductive cable pad terminating a first end of a respective conductive trace;
and, a plurality of conductive cable pads at the second terminating end, each conductive cable pad terminating a second end of a respective conductive trace;
a component carrier substrate with conductive pads; and,
an electronic device on the component carrier substrate, the electronic device including solder balls, a first plurality of said solder balls connected to the conductive pads on the component carrier substrate and also connectable to the conductive cable pad at the first terminating end, and a second plurality of solder balls connected to the conductive cable pads at the first terminating end and also connectable to the conductive pads on the component carrier substrate.

19. The electronic assembly of claim 18, a first wideband low-loss transmission means for propagating signals including at least one coplanar waveguide.

20. The electronic assembly of claim 19, the signal and ground conductive traces also defining a differential signal trace pair and a low speed serial signal trace.

21. The electronic assembly of claim 18, a first wideband low-loss transmission means for propagating signals including at least one grounded coplanar waveguide.

22. The electronic assembly of claim 21, the signal and ground conductive traces also defining a differential signal trace pair and a low speed serial signal trace.

23. The electronic assembly of claim 18, a first wideband low-loss transmission means for propagating signals including a one coplanar waveguide for propagating signals including at a rate exceeding 40 Gbps.

24. The electronic assembly of claim 18, wherein the electronic device is a flip chip die and the component carrier substrate is a ball grid array substrate.

25. The electronic assembly of claim 24, a first wideband low-loss transmission means for propagating signals including at least one coplanar waveguide.

26. The electronic assembly of claim 25, the signal and ground conductive traces also defining a differential signal trace pair and a low speed serial signal trace.

27. The electronic assembly of claim 24, a first wideband low-loss transmission means for propagating signals including at least one grounded coplanar waveguide.

* * * * *